(12) United States Patent
Tokunaga et al.

(10) Patent No.: US 8,749,260 B2
(45) Date of Patent: Jun. 10, 2014

(54) TEST WAFER UNIT AND TEST SYSTEM

(75) Inventors: Yasuo Tokunaga, Gunma (JP); Yoshio Komoto, Gunma (JP)

(73) Assignee: Advantest Corporation, Tokyo (JP)

( * ) Notice: Subject to any disclaimer, the term of this patent is extended or adjusted under 35 U.S.C. 154(b) by 201 days.

(21) Appl. No.: 12/947,713

(22) Filed: Nov. 16, 2010

(65) Prior Publication Data

US 2011/0133768 A1    Jun. 9, 2011

Related U.S. Application Data

(63) Continuation of application No. PCT/JP2008/059390, filed on May 21, 2008.

(51) Int. Cl.
*G01R 31/00*    (2006.01)

(52) U.S. Cl.
USPC .................................................. 324/756.05

(58) Field of Classification Search
CPC .............. G01R 31/318511; G01R 31/2831; G01R 31/31723
USPC ............... 324/762.01–762.1, 754.01–754.3, 324/755.01–755.1
See application file for complete search history.

(56) References Cited

U.S. PATENT DOCUMENTS

| | | | | |
|---|---|---|---|---|
| 6,977,514 B2 * | 12/2005 | Kohno et al. | ............ | 324/754.18 |
| 7,046,027 B2 * | 5/2006 | Conner | .................... | 324/756.03 |
| 7,109,736 B2 * | 9/2006 | Long | ........................ | 324/762.02 |
| 7,400,134 B2 * | 7/2008 | Morishita et al. | ........ | 324/762.02 |
| 2001/0047496 A1 | 11/2001 | Hidaka et al. | | |
| 2004/0175850 A1 | 9/2004 | Shimizu et al. | | |
| 2004/0239359 A1 | 12/2004 | Matsumoto | | |
| 2005/0225336 A1 | 10/2005 | Kojima | | |
| 2008/0010824 A1 | 1/2008 | Kojima | | |

FOREIGN PATENT DOCUMENTS

| | | |
|---|---|---|
| JP | H05259245 A | 10/1993 |
| JP | 2001-210685 A | 8/2001 |
| JP | 2001-338953 A | 12/2001 |
| JP | 2002-222839 A | 8/2002 |
| JP | 2004-354357 A | 12/2004 |
| TW | 530360 | 5/2003 |
| WO | 03/062837 A1 | 7/2003 |

OTHER PUBLICATIONS

International Search Report (ISR) issued in PCT/JP2008/059390 (parent application) mailed in Aug. 2008 for Examiner consideration, citing U.S. Patent Application Publication Nos. 3-5 and Foreign Patent document Nos. 3-5 listed above.
Written Opinion (PCT/ISA/237) issued in PCT/JP2008/059390 (parent application) mailed in Aug. 2008.
Tw Office Action/ Search Report and English Translation Dated Oct. 24, 2012; Application No. 098114218.
JP Office Action/ Search Report and Computer Translation Dated Apr. 30, 2013; Application No. 2010-512889.

\* cited by examiner

*Primary Examiner* — Tung X Nguyen

(57) ABSTRACT

Provided is a test wafer unit that tests a plurality of devices under test formed on a wafer under test, the test wafer unit comprising a plurality of test circuits that are formed on the same semiconductor wafer, where a plurality of types of the test circuits having different functions are provided for each device under test; and a selecting section that selects which type of test circuit is electrically connected to each pad of a device under test. Therefore, the test wafer unit can select the test circuit corresponding to testing content to be performed and connect this test circuit to the device under test to perform testing on a variety of devices under test or to perform a variety of tests on a device under test.

20 Claims, 7 Drawing Sheets

TEST WAFER UNIT AND TEST SYSTEM

BACKGROUND

1. Technical Field

The present invention relates to a test wafer unit and a test system. In particular, the present invention relates to a test wafer unit and a test system for testing a plurality of semiconductor chips formed on a semiconductor wafer.

2. Related Art

A know apparatus for testing semiconductor chips is an apparatus that tests pass/fail of each of a plurality of semiconductor chips formed on a semiconductor wafer, as shown in, for example, Patent Document 1. This apparatus may include a probe card that can be electrically connected to a plurality of semiconductor chips en bloc.

Patent Document 1: Japanese Patent Application Publication No. 2002-222839

Patent Document 2: International Publication WO 2003/062837

Generally, a probe card is formed using a print substrate or the like, as shown in Patent Document 2, for example. By forming a plurality of probe pins on the print substrate, the resulting probe card can be electrically connected to a plurality of semiconductor chips en bloc.

One test for a semiconductor chip involves using BOST circuits. In this case, the BOST circuits can be loaded on the probe card, but when a plurality of semiconductor chips on a semiconductor wafer are tested together, a large number of BOST circuits must be loaded thereon and it becomes difficult to mount the BOST circuits on the print substrate of the probe card.

Another test for a semiconductor chip involves using BIST circuits provided in the semiconductor chip. With this method, however, circuits that are not used for actual operation are formed in the semiconductor chip, and this decreases the area in which actual operation circuits of the semiconductor chip can be formed.

There are a variety of tests that can be performed on the semiconductor chips, including a DC test for judging whether the DC power consumed by a semiconductor chip fulfills certain specifications, a function test for judging whether a semiconductor chip outputs a prescribed output signal in response to an input signal, and an analog test for judging whether characteristics of a signal output by a semiconductor chip fulfill certain specifications. When BOST circuits are provided on the print substrate or BIST circuits are provided in the semiconductor chips, however, it becomes difficult to perform such a variety of tests.

SUMMARY

Therefore, it is an object of an aspect of the innovations herein to provide a test wafer unit and a test system, which are capable of overcoming the above drawbacks accompanying the related art. The above and other objects can be achieved by combinations described in the independent claims. According to a first aspect related to the innovations herein, provided is a test wafer unit that tests a plurality of devices under test formed on a wafer under test, the test wafer unit comprising a plurality of test circuits that are formed on the same semiconductor wafer, where a plurality of types of the test circuits having different functions are provided for each device under test; and a selecting section that selects which type of test circuit is electrically connected to each pad of a device under test.

According to a second aspect related to the innovations herein, provided is a test system that tests a plurality of devices under test formed on a wafer under test, the test system comprising a test wafer unit that is electrically connected to the wafer under test; and a control apparatus that controls the test wafer unit. The test wafer unit includes a plurality of test circuits that are formed on the same semiconductor wafer, where a plurality of types of the test circuits having different functions are provided for each device under test; and a selecting section that selects which type of test circuit is electrically connected to each pad of a device under test.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
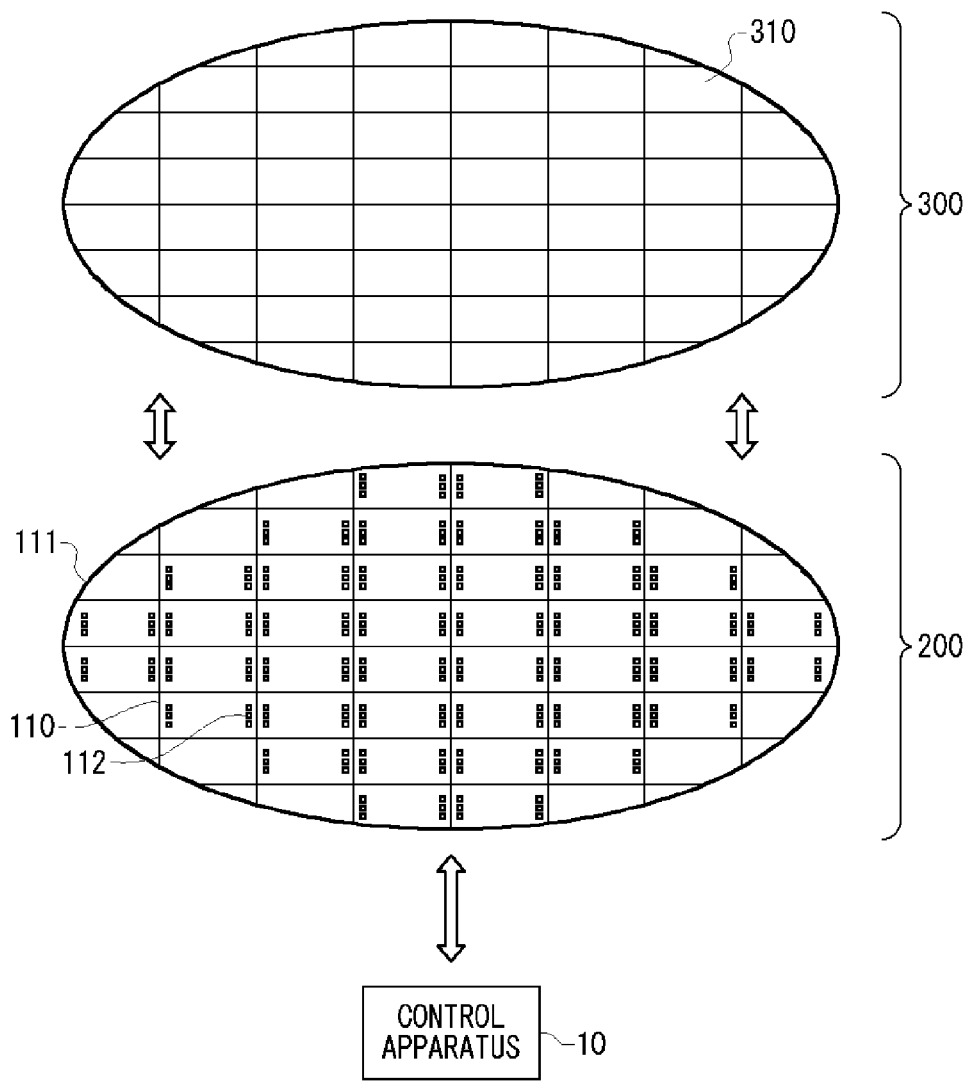
FIG. 1 is a schematic view of a test system 400.

FIG. 1 is a schematic view of a test system 400. The test system 400 tests a plurality of devices under test 310 formed on a wafer under test 300. The test system 400 of the present embodiment includes a test wafer unit 200 and a control apparatus 10. FIG. 1 shows the wafer under test 300 and the test wafer unit 200 from a perspective view.

The wafer under test 300 may be disc-shaped. More specifically, the wafer under test 300 may be silicon, a compound semiconductor, or some other type of semiconductor wafer. The devices under test 310 may be formed on the semiconductor wafer using a semiconductor process such as lithography.

The test wafer unit 200 is electrically connected to the wafer under test 300. More specifically, the test wafer unit 200 is electrically connected to the devices under test 310 of the wafer under test 300 en bloc. The test wafer unit 200 of the present embodiment includes a test wafer 111.

The test wafer 111 may be a semiconductor wafer formed of the same semiconductor material as the wafer under test 300. For example, the test wafer 111 may be a silicon wafer. The test wafer 111 may be formed of a semiconductor material having substantially the same thermal expansion coefficient as the wafer under test 300. The test wafer 111 may have a shape corresponding to the wafer under test 300. Here, a "corresponding shape" refers to the same shape or to a shape by which one wafer is a portion of the other.

For example, the test wafer 111 may be a wafer having the same shape as the wafer under test 300. More specifically, the test wafer 111 may be disc-shaped and have a diameter substantially equal to that of the wafer under test 300. The test wafer 111 may have a shape that covers a portion of the wafer under test 300 when the test wafer 111 and the wafer under test 300 are stacked. When the wafer under test 300 is disc-shaped, the test wafer 111 may have a shape that occupies a portion of this disc, such as a half-circle shape.

A plurality of circuit blocks 110 are formed on the test wafer 111. The circuit blocks 110 are provided to correspond to the devices under test 310. In the present embodiment, the circuit blocks 110 correspond one-to-one with the devices under test 310. Each circuit block 110 may be provided at a position that overlaps with a region in which the corresponding device under test 310 is formed when the test wafer 111 and the wafer under test 300 are stacked. By stacking the test wafer 111 and the wafer under test 300, each circuit block 110 may be electrically connected to the corresponding device under test 310 to test this device under test 310.

The circuit blocks 110 may be provided on the back of the surface of the test wafer 111 facing the wafer under test 300. In this case, each circuit block 110 may be electrically connected to the corresponding device under test 310 using a via hole formed in the test wafer 111.

Here, an "electrical connection" may refer to a state in which the transmission of electrical signals is possible between two components. For example, the circuit blocks 110 and input/output pads of the devices under test 310 may be electrically connected through direct contact or through indirect contact via another conductor. For example, the test system 400 may include a probe member such as a membrane sheet between the wafer under test 300 and the test wafer 111, having substantially the same diameter as these wafers. The membrane sheet includes bumps that electrically connect corresponding input/output pads of the circuit blocks 110 and the devices under test 310 to each other. The test system 400 may include an anisotropic conductive sheet between the membrane sheet and the test wafer 111.

The input/output pads of the devices under test 310 and the circuit blocks 110 may be electrically connected in a non-contact state, via capacitive coupling, also known as electrostatic coupling, or inductive coupling, also known as magnetic coupling, for example. A portion of the transmission lines between the input/output pads of the devices under test 310 and the circuit blocks 110 may be optical transmission lines.

Since the test wafer 111 of the present embodiment is made of the same semiconductor material as the wafer under test 300, even if the surrounding temperature fluctuates, a good electrical connection can be maintained between the test wafer 111 and the wafer under test 300. Therefore, when the wafer under test 300 is heated for testing, the wafer under test 300 can still be accurately tested.

Since the test wafer 111 is formed of a semiconductor material, the circuit blocks 110 can be easily formed with high density on the test wafer 111. For example, the circuit blocks 110 can be easily formed with high density on the test wafer 111 with a semiconductor process using lithography or the like. Therefore, a large number of circuit blocks 110 corresponding to a large number of devices under test 310 can be formed relatively easily on the test wafer 111.

When the circuit blocks 110 are provided on the test wafer 111, the size of the control apparatus 10 can be decreased. In other words, since the test system 400 of the present embodiment includes the circuits for testing the devices under test 310 in the test wafer unit 200, the control apparatus 10 can test the devices under test 310 by controlling the test wafer unit 200. For example, the control apparatus 10 should include a function for providing the circuit blocks 110 with notification concerning the timing at which testing is initiated or the like, a function for reading test results of the circuit blocks 110, and a function for supplying drive power for the circuit blocks 110 and devices under test 310.

If the devices under test 310 formed on the wafer under test 300 have the same circuit configuration, each circuit block 110 of the test wafer 111 may have the same circuit configuration. Furthermore, a plurality of connection pads 112, which are electrically connected to corresponding input/output pads of the device under test 310, are formed on the test wafer 111 in individual regions corresponding respectively to the devices under test 310. If the input/output pads of the devices under test 310 have the same arrangement, the connection pads 112 are arranged in the same manner in each individual region.

Figure 2:
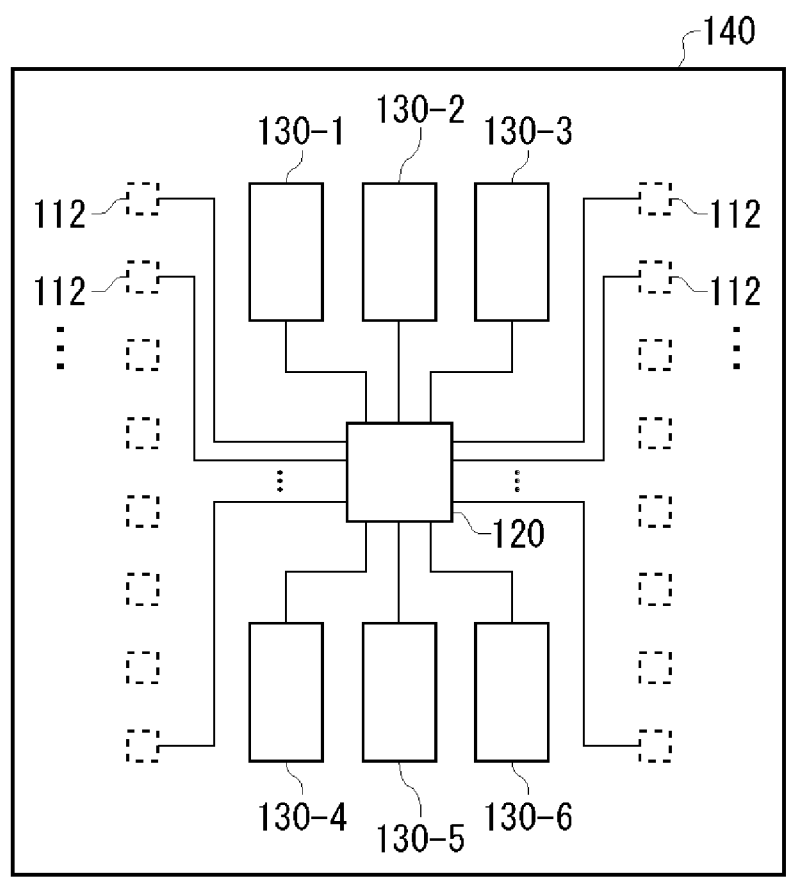
FIG. 2 shows an exemplary configuration of a circuit block 110.

FIG. 2 shows an exemplary configuration of a circuit block 110. As described above, each circuit block 110 is formed on the test wafer 111 in an individual region 140 corresponding to a device under test 310. The circuit blocks 110 may be provided in the individual regions 140 on the back surface of the test wafer 111, which is the back of the surface facing the wafer under test 300. Instead, the connection pads 112 may be formed in the individual regions 140 on the surface of the test wafer 111 facing the wafer under test 300.

Each circuit block 110 includes a plurality of types of test circuits 130 and a selecting section 120. The type of each test circuit 130 may be determined by the function of the test circuit 130 or by the testing content performed by the test circuit 130. Furthermore, the type of a test circuit 130 may be determined by the specification of input and output signals of the test circuit 130. For example, the types of test circuits 130 formed in each circuit block 110 may include a test circuit 130 that uses an analog signal to test an analog circuit of the device under test 310, a test circuit 130 that uses a digital signal to test a digital circuit of the device under test 310, a test circuit 130 that uses a high-frequency signal to test a high-frequency circuit of the device under test 310, a test circuit 130 that controls a memory of the device under test 310 to test this memory, a test circuit 130 that supplies power to the device under test 310, or the like.

The selecting section 120 selects which type of test circuit 130 is electrically connected to each input/output pad of the corresponding device under test 310. The selecting section 120 of the present embodiment selects which type of test circuit 130 is electrically connected to each connection pad 112 connected to the device under test 310. The control apparatus 10 shown in FIG. 1 may supply the selecting section 120 with a setting signal to set which test circuit 130 is electrically connected to each connection pad 112. The selecting section 120 may include a register that stores the setting signals supplied from the control apparatus 10.

The selecting section 120 is electrically connected to input/output terminals of the test circuits 130 provided to the corresponding circuit block 110. The selecting section 120 is also electrically connected to the connection pads 112 provided to correspond to the circuit block 110, through via holes passing through the test wafer 111. The selecting section 120 may include switches that switch the connections between the input/output terminals of the test circuits 130 and the connection pads 112.

With this configuration, a plurality of types of devices under test 310 having different functions for each pin can be tested using a common test wafer unit 200. In other words, the plurality of types of devices under test 310 can be tested as a result of the selecting section 120 switching the connections between the test circuits 130 and the connection pads 112 according to the function of each pin of the device under test 310.

The test circuits 130 may be provided in each circuit block 110 such that the number of input/output terminals of the test circuits 130 to be connected to the connection pads 112 is equal to the number of connection pads 112. In this case, the types of signals output by the overall circuit block 110 does not change, but it is possible to switch which type of signal is output from which connection pad 112.

The test circuits 130 may be provided in each circuit block 110 such that the number of input/output terminals of the test circuits 130 to be connected to the connection pads 112 is greater than the number of connection pads 112. A plurality of types of test circuits 130 may be provided for each connection pad 112. In this case, the type of test circuit 130 to be connected to each connection pad 112 can be selected independently for each connection pad 112, and therefore a greater variety of tests can be performed. A plurality of test circuits 130 may be provided for each set of a prescribed number of connection pads 112 in each circuit block 110.

Figure 3:
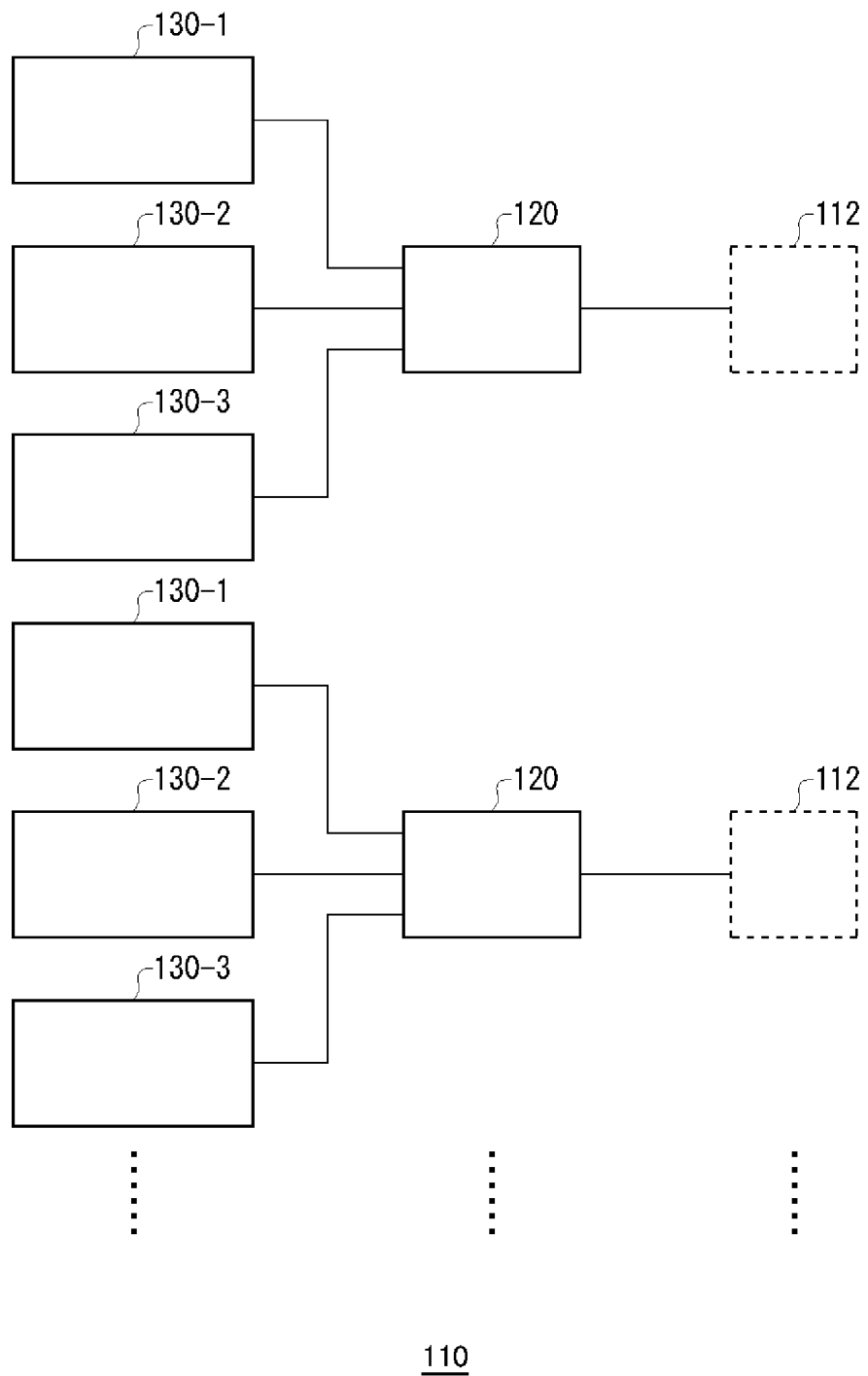
FIG. 3 shows another exemplary configuration of a circuit block 110.

FIG. 3 shows another exemplary configuration of a circuit block 110. FIG. 3 shows a portion of the circuit block 110, but other regions of the circuit block 110 may be the same as shown in FIG. 3. The circuit block 110 of the present embodiment includes a greater number of test circuits 130 than connection pads 112. Here, the number of test circuits 130 may be equal to the number of input/output terminals of the test circuits 130 to be connected to the connection pads 112. The same combination of types of test circuits 130 may be provided for each connection pad 112 in a circuit block 110.

The circuit block 110 of the present embodiment includes a plurality of selecting sections 120 corresponding one-to-one with the plurality of connection pads 112. Each selecting section 120 selects which type of test circuit 130 among the corresponding test circuits 130 the corresponding connection pad 112 is connected to. With this configuration, a variety of devices under test 310 can be tested using a common test wafer 111.

Figure 4:
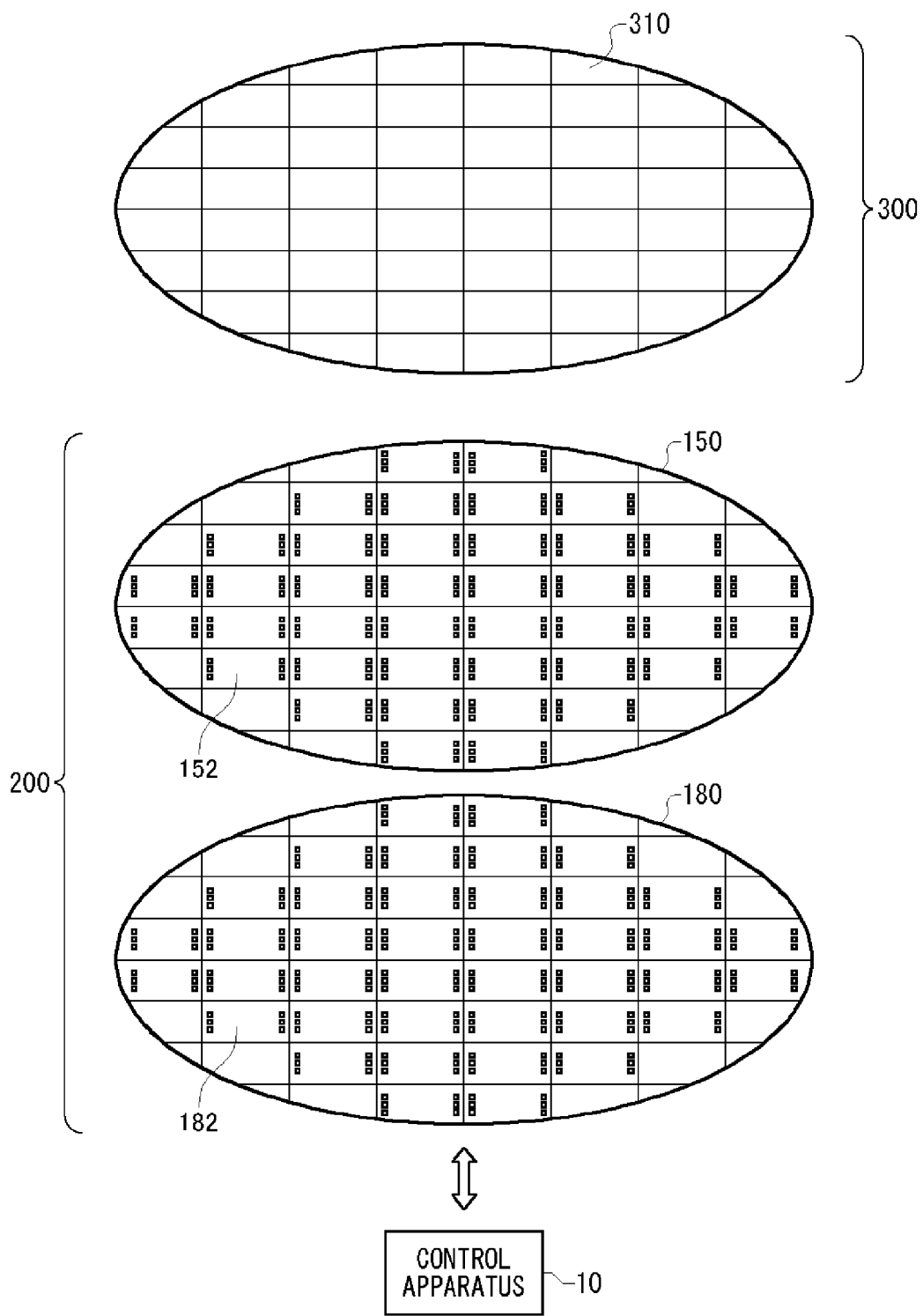
FIG. 4 shows another exemplary configuration of the test wafer unit 200.

FIG. 4 shows another exemplary configuration of the test wafer unit 200. The test wafer unit 200 of the present embodiment includes a circuit wafer 180 and a connection wafer 150. The circuit wafer 180 includes a plurality of circuit blocks 182 corresponding to the plurality of devices under test 310, in the same manner as the test wafer 111. The connection wafer 150 includes a plurality of circuit blocks 152 corresponding to the plurality of devices under test 310.

The circuit blocks 182 of the circuit wafer 180 and the circuit blocks 152 of the connection wafer 150 correspond one-to-one. Corresponding circuit blocks 182 and circuit blocks 152 are electrically connected to each other. In the same manner as the test wafer 111, the circuit wafer 180 and the connection wafer 150 may be formed of the same semiconductor material as the wafer under test 300, and may have substantially the same diameter as the wafer under test 300.

Each circuit block 182 of the circuit wafer 180 is provided with a plurality of the test circuits 130 described in relation to FIGS. 1 to 3. Each circuit block 152 of the connection wafer 150 is provided with a plurality of the selecting sections 120 described in relation to FIGS. 1 to 3.

The connection wafer 150 is provided between the circuit wafer 180 and the wafer under test 300, and electrically connects the test circuits 130 of the circuit wafer 180 to the devices under test 310 of the wafer under test 300. The connection wafer 150 may be electrically connected to the circuit wafer 180 via an anisotropic conductive sheet. The connection wafer 150 may be electrically connected to the wafer under test 300 via an anisotropic conductive sheet and a membrane with bumps. The control apparatus 10 may control each test circuit 130, in the same manner as the control apparatus 10 described in relation to FIGS. 1 to 3.

Figure 5:
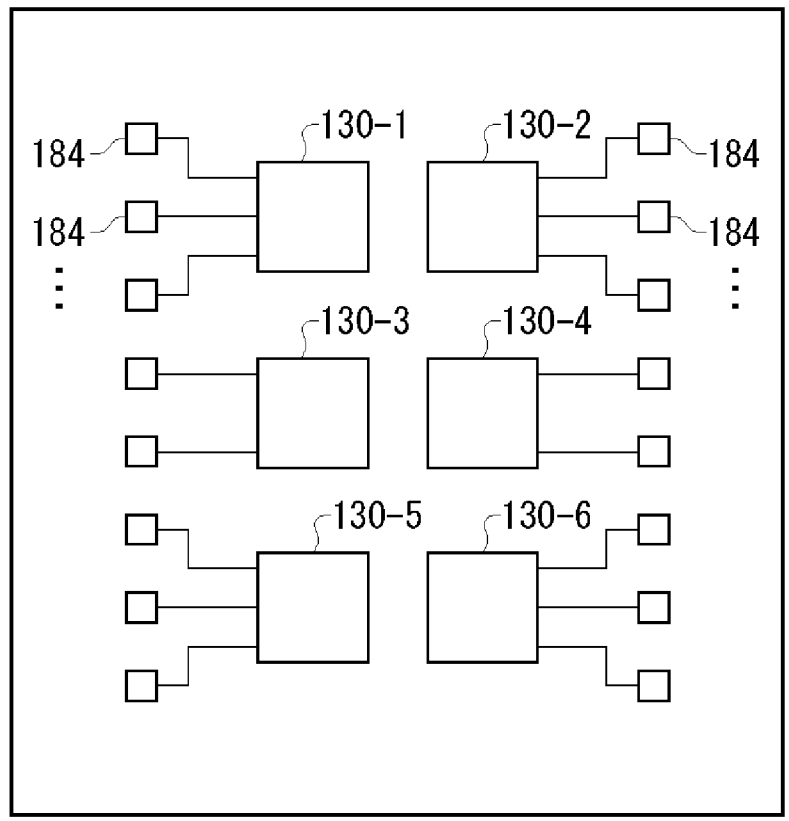
FIG. 5 shows an exemplary configuration of a circuit block 182 in the circuit wafer 180.

FIG. 5 shows an exemplary configuration of a circuit block 182 in the circuit wafer 180. The circuit block 182 differs from the circuit block 110 described in relation to FIG. 2 by not including a selecting section 120. The remaining configuration of this circuit block 110 may be the same as that of the circuit block 110 described in relation to FIG. 2.

The circuit block 182 of the present embodiment includes a plurality of types of test circuits 130 and a plurality of intermediate pads 184. Each input/output terminal of the test circuits 130 is electrically connected to a corresponding intermediate pad 184. The intermediate pads 184 may be provided to correspond one-to-one with the input/output terminals of the test circuits 130.

Each intermediate pad 184 is electrically connected to the connection wafer 150. The intermediate pads 184 and the test circuits 130 may be formed on the surface of the circuit wafer 180 facing the connection wafer 150, or may be formed on the back of this surface. If the intermediate pads 184 are formed on the back surface of the circuit wafer 180, the intermediate pads 184 are electrically connected to the connection wafer 150 through via holes formed in the circuit wafer 180.

Figure 6:
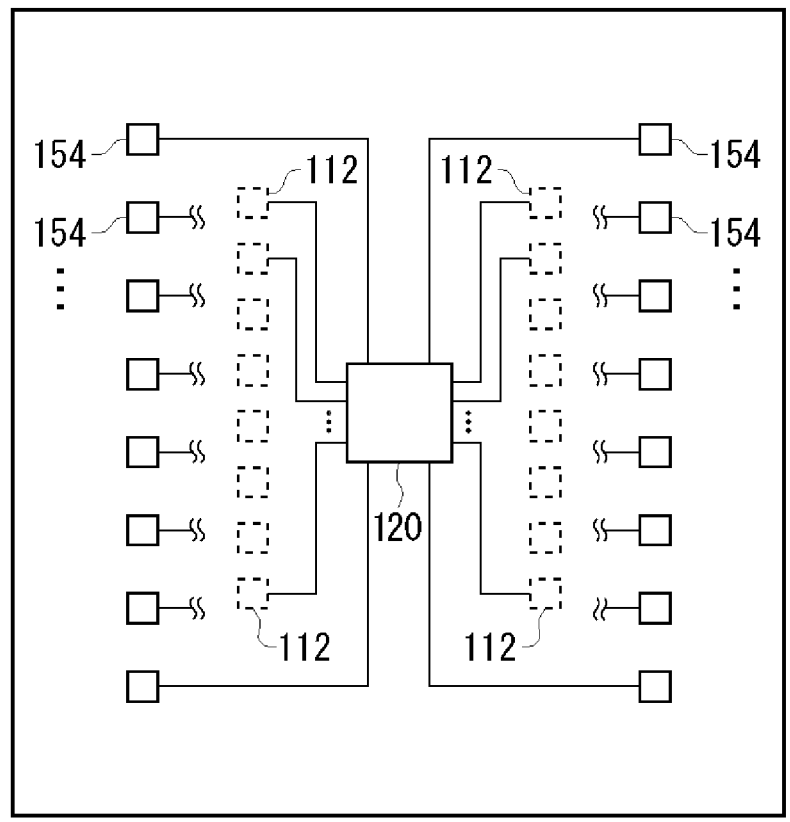
FIG. 6 shows an exemplary configuration of a circuit block 152 in the connection wafer 150.

FIG. 6 shows an exemplary configuration of a circuit block 152 in the connection wafer 150. The circuit block 152 includes a selecting section 120 and a plurality of intermediate pads 154. The circuit blocks 152 may be formed on a surface of the connection wafer 150 facing the circuit wafer 180. A plurality of connection pads 112 electrically connected to the device under test 310 are formed on the connection wafer 150 on the back surface of the circuit blocks 152.

The intermediate pads 154 are electrically connected to intermediate pads 184 of the corresponding circuit block 182. The intermediate pads 154 may be provided to correspond one-to-one with the intermediate pads 184. The intermediate pads 154 may be provided at the same intervals as the intermediate pads 184, in order to be connectable to the intermediate pads 184.

The selecting section 120 selects which intermediate pad 154 each connection pad 112 is electrically connected to. If the connection pads 112 and the intermediate pads 154 correspond one-to-one, the selecting section 120 may include switches for switching the connections between the intermediate pads 154 and the connection pads 112.

In the same manner as the example of FIG. 3, the circuit block 152 may include a selecting section 120 for each connection pad 112. In this case, the circuit block 152 may be provided with a greater number of intermediate pads 154 than connection pads 112. The circuit block 152 may include a selecting section 120 for each set of a prescribed number of connection pads 112.

Figure 7:
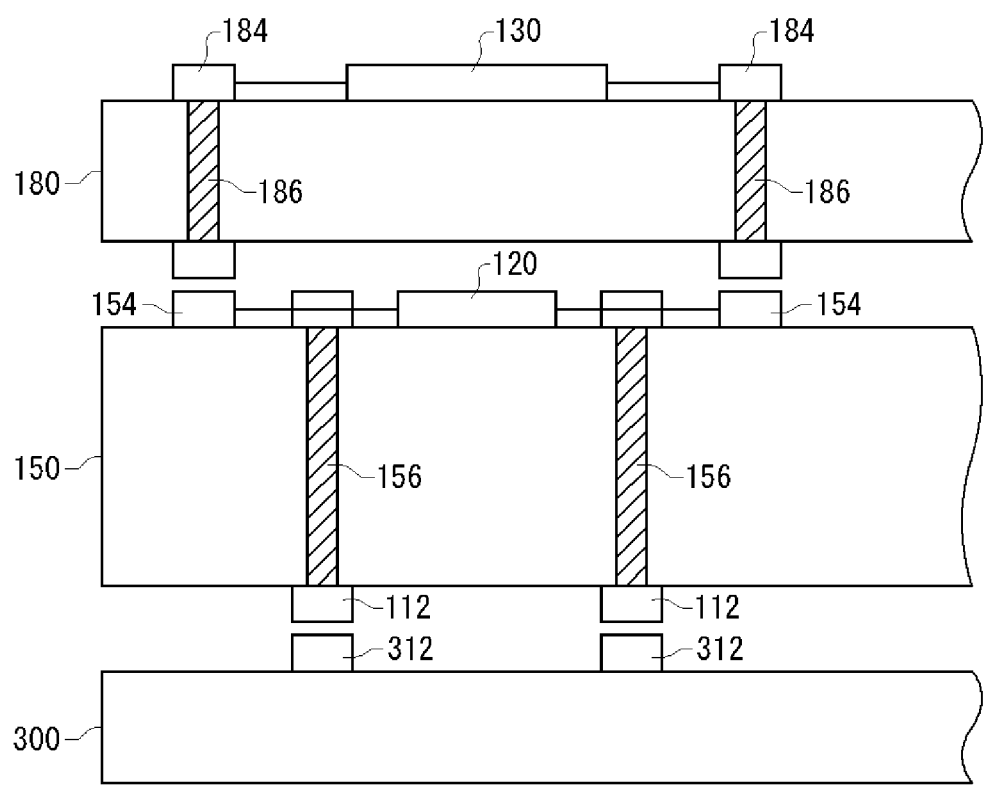
FIG. 7 shows connections between the circuit wafer 180, the connection wafer 150, and the wafer under test 300.

FIG. 7 shows connections between the circuit wafer 180, the connection wafer 150, and the wafer under test 300. FIG. 7 shows a partial cross section of the circuit wafer 180, the connection wafer 150, and the wafer under test 300.

A plurality of test circuits 130 are formed on the top surface of the circuit wafer 180. Each test circuit 130 is electrically connected to the intermediate pads 154 of the connection wafer 150 arranged on the bottom surface of the circuit wafer 180, via intermediate pads 184 and via holes 186.

The selecting section 120 is formed on the top surface of the connection wafer 150 facing the circuit wafer 180. The selecting section 120 is electrically connected to the intermediate pads 184 of the circuit wafer 180 via the intermediate pads 154 provided on the top surface of the connection wafer 150.

The selecting section 120 is also electrically connected to the connection pads 112 provided on the bottom surface of the connection wafer 150, which faces the wafer under test 300. The selecting section 120 may be electrically connected to the connection pads 112 through the via holes 156 formed through the connection wafer 150. The selecting section 120 selects intermediate pads 154 to be connected to the connection pads 112.

The connection pads 112 are provided at the same intervals as the input/output pads 312 of the wafer under test 300. The intermediate pads 154 are provided at the same intervals as the intermediate pads 184 of the circuit wafer 180, and therefore the intermediate pads 154 may be provided at different intervals than the connection pads 112.

With this configuration, a test circuit 130 can be selected according to the content of the test to be executed, and connected to the device under test 310. Therefore, a variety of devices under test 310 can be tested. Furthermore, a variety of tests can be performed on each device under test 310.

The connection wafer 150 may be thicker than the circuit wafer 180. In other words, the circuit wafer 180 may be relatively thin. By using a thin wafer as the circuit wafer 180, the time needed to form the via holes 186 in the circuit wafer 180 can be shortened, thereby decreasing the damage to the test circuit 130 during formation of the via holes 186. By fixing the circuit wafer 180 to the connection wafer 150, which is relatively thick, the strength of the test wafer unit 200 can be improved.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor test wafer unit that tests a plurality of semiconductor devices under test formed on a semiconductor wafer under test, the test wafer unit comprising:
a plurality of circuit blocks that are formed on a semiconductor test water, each circuit block including a plurality of test circuits having different functions for testing one of the plurality of devices under test, each circuit block formed on an individual region of the test wafer that corresponds to one of the plurality of devices under test such that each circuit block contacts the corresponding device under test when the test wafer is stacked with the wafer under test, and each circuit block including a selecting section that selects which of the plurality of test circuits is electrically connected to each of a plurality of input/output pads of the corresponding, device under test.

2. The test wafer unit according to claim 1, wherein each circuit block includes a plurality of connection pads that correspond to the plurality of pads of the corresponding one of the plurality of devices under test, and wherein the selecting, section of each circuit block selects which of the plurality of test circuits is electrically connected to each connection pad.

3. The test wafer unit according to claim 2, wherein the test wafer has a shape corresponding to the wafer under test, and the plurality of test circuits of each circuit block have substantially the same configuration.

4. The test wafer unit according to claim 3, wherein the plurality of connection pads of each circuit block have substantially the same arrangement.

5. The test wafer unit according to claim 4, wherein each circuit block has a greater number of the plurality of test circuits than of the plurality of connection pads.

6. The test wafer unit according to claim 1, further comprising:
a circuit wafer on which the plurality of test circuits are formed; and
a connection wafer that is provided between the circuit wafer and the wafer under test and that has a selecting section formed thereon.

7. The test wafer unit according to claim 6, wherein the connection wafer includes:
a plurality of connection pads that are provided on a surface of the connection wafer facing the wafer under test and that correspond to pads of the devices under test; and
a plurality of intermediate pads that are provided on the surface of the connection wafer facing the circuit water, that are firmed at different intervals than the connection pads, and that are electrically connected to the circuit wafer.

8. The test wafer unit according to claim 7, wherein the intermediate pads are provided to correspond to the test circuits formed on the circuit wafer, and the selecting section selects which of the intermediate pads is electrically connected to each connection pad.

9. A test system that tests a plurality of semiconductor devices under test formed on a semiconductor wafer under test, the test system comprising:
a semiconductor test wafer unit that is electrically connected to the wafer under test; and
a control apparatus that controls the test wafer unit;
wherein the test wafer unit includes:
a plurality of circuit blocks that are formed on a semiconductor test water, each circuit block including a plurality of test circuits having different functions for testing one of the plurality of devices under test, each circuit block formed on an individual region of the test wafer that corresponds to one of the plurality of devices under test such that each circuit block contacts the corresponding device under test when the test wafer is stacked with the wafer under test, and each circuit block including a selecting section that selects which of the plurality of test circuits is electrically connected to each of a plurality of input/output pads of the corresponding device under test.

10. The test system according to claim 9, wherein each circuit block includes a plurality of connection pads that correspond to the plurality of pads of the corresponding one of the plurality of devices under test, and wherein the selecting section of each circuit block selects which of the plurality of test circuits is electrically connected to each connection pad.

11. The test system according to claim 10, wherein the test wafer has a shape corresponding to the wafer under test, and the plurality of test circuits of each circuit block have substantially the same configuration.

12. The test system according to claim 11, wherein the plurality of connection pads of each circuit block have substantially the same arrangement.

13. The test system according to claim 12, wherein each circuit block has a greater number of the plurality of test circuits than of the plurality of connection pads.

14. The test system according to claim 9, further comprising a probe member between the test wafer and the wafer under test.

15. The test system according to claim 14, further comprising an anisotropic conductive sheet between the probe member and the test wafer.

16. A device comprising:
plurality of test circuits formed on an individual region of a semiconductor test wafer having different functions for testing a corresponding semiconductor device under test formed on a semiconductor wafer under test, the individual region corresponding to the corresponding device under test such that each circuit block contacts the corresponding device under test when the test wafer is stacked with the wafer under test; and
a selecting section that selects which of the plurality of test circuits is electrically connected to each of a plurality of input/output pads of the corresponding device under test.

17. The device according to claim 16, further comprising a plurality of connection pads that correspond to the plurality of pads of the corresponding device under test, and wherein the selecting section selects which of the plurality of test circuits is electrically connected to each connection pad.

18. The device according to claim 17, wherein there is a greater number of the plurality of test circuits than of the plurality of connection pads.

19. The device according to claim 17, wherein the selecting section includes a register that stores a setting signal which sets which of the plurality of test circuits is electrically connected to each connection pad.

20. The test wafer unit according to claim 1, wherein the selecting section of each circuit block includes a register that stores a setting signal which sets which of the plurality of test circuits is electrically connected to each connection pad.

* * * * *